United States Patent [19]
Narayanan

[11] Patent Number: 5,847,565
[45] Date of Patent: Dec. 8, 1998

[54] LOGIC DEVICE

[75] Inventor: Chandrakumar Narayanan, Madras, India

[73] Assignee: Council of Scientific and Industrial Research, New Delhi, India

[21] Appl. No.: 828,515

[22] Filed: Mar. 31, 1997

[51] Int. Cl.$^6$ .................................................. G01V 3/00
[52] U.S. Cl. ........................................ 324/322; 324/300
[58] Field of Search .................................... 324/314, 318, 324/322, 300, 309

[56] References Cited

U.S. PATENT DOCUMENTS

| | | | |
|---|---|---|---|
| 3,886,439 | 5/1975 | Laukien | 324/314 |
| 4,065,714 | 12/1977 | Hill | 324/314 |
| 5,442,292 | 8/1995 | Kolem et al. | 324/322 |

OTHER PUBLICATIONS

Adleman, Leonard M., "Molecular Computation of Solutions to Combinatorial Problems", *Science*, vol. 266, pp. 1021–1024.

Lipton, Richard J., "DNA Solution of Hard Computational Problems", *Science*, vo., 268, pp. 542–545.

Birge, Robert R., "Protein–Based Computers: devices fabricated from biological molecules promise compact size and faster data storage. They lend themselves to use in parallel-–processing computers, three–dimensional memories and neural networks", *Scientific America*, pp. 66–71.

Fernback, Sidney and Proctor, Warren G., "Spin–Echo Memory Device", *Journal of Applied Physics*, vo. 26, pp. 170–180.

Anderson, A.G., Garwin R. I., Hahn, E.L. Horton, J.W., Tucker, G.L., and Walker, R.M., "Spin Echo Serial Storage Memory", *Journal of Applied Physics*, vo. 26, pp. 1324–1338.

Brewer, Richard G. and Hahn, Erwin L., "Atomic Memory: Atomic Systems that have decayed from some ordered states can be induced to recover their initial order. The degree to which order is restored allows investigation of interactions difficult to observe", *Scientific American*, pp. 50–57.

*Primary Examiner*—Louis Arana
*Attorney, Agent, or Firm*—Merchant, Gould, Smith, Edell, Welter & Schmidt

[57] ABSTRACT

The invention relates to an improved logic device providing fast logic implementation based on the magnetic resonance of a collection of interacting or non-interacting spins or spin systems. This fast logic device can form the centerpiece of a novel spin computer or hybrid spin computer. In one implementation, the logic device includes a spin system with a sufficiently long relaxation time in a magnetic field which provides a bi-stable state. A probehead, console and receiver enable the system to access the bi-stable state using magnetic resonance excitation and detection, and field gradients permit addressing of distinct memory cells in the spin system.

7 Claims, 3 Drawing Sheets

LOGIC DEVICE

FIELD OF THE INVENTION

The present invention relates to an improved logic device. The improved logic device of the present invention provides fast logic implementation, based on the Magnetic Resonance of a collection of interacting or non-interacting spins-½ referred to in the following as a spin systems. Such a fast logic device can form the centerpiece of a novel Spin Computer or Hybrid Spin Computer.

BACKGROUND OF THE INVENTION

At its fundamental level, a logic system is essentially based on an array of bi-state switches. Conventional logic devices are based on silicon semiconductor technology. The two states of the system are referred to as the 'High' and 'Low' states, corresponding nominally to voltages of 5V and 0V respectively.

A computer is based on a logic system as shown in FIG. 1 of the drawings accompanying this specification and essentially comprises of a Memory (3), a Central processing unit (2) and an Arithmetic Logic Unit (1). The Memory serves to 'store' information that can be accessed rapidly by the 2, for operations in the 1. Modern Computer Memory is normally implemented as a 'volatile' dynamic random access memory (DRAM) where the memory cells are periodically refreshed. Standard Computers are devices where data is processed 'serially'. There has also been considerable interest in 'parallel' architectures, which result in much higher operating speeds. Parallel architectures are currently implemented based on an array of semiconductor-computer-based nodes.

Apart from several developments in semiconductor-based logic and computer systems, 'molecular computers', which are essentially based on molecular switches, are presently being developed as alternatives for possible special applications. Especially, 'Protein computers' and 'DNA computers' have particularly received much attention from many modern researchers. It is pertinent to mention here that the development of alternative architectures such as those could eventually lead to applications that cannot be envisaged at present.

As reported by L. M. Adleman ( Science 266, 1021,1994), R. J. Lipton (Science, 268, 542, 1995) and R. R. Birge (Scientific American, 272, 66, 1995), considerable current effort in developing bimolecular computers is mainly oriented towards protein computers employing especially bacteriorhodopsin, and still more recently, DNA computers.

In molecular computers information is stored in molecular switches which involve making, breaking or reorienting of molecular bonds that require energy quantum of the order of molecular bond energies and interaction energies. Reusability of the logic device is comparatively shorter than that of the normal silicon devices.

Five years after the discovery of nuclear spin echoes, Proctor et al (Journal of Applied Physics, 26, 170, 1955) and Hahn et al ( Journal of Applied Physics, 26, 1324 1955; Scientific American, 251, 42, 1984) demonstrated the possible application of nuclear spin systems as memory devices, employing the echo phenomenon to recall, either in reverse order by spin echoes or in normal order by stimulated echoes, a series of events that had been 'registered' in the linear response regime of the spin system. No further development has so far been reported on this matter, probably because of the simple reason that this would have been a relatively slower device. A block diagram of such a memory device using nuclear spin system is shown in FIG. 2 of the drawings accompanying this specification. Various components of the device, as shown in FIG. 2 with numerals, are described below.

4 refers to the RF (Resonant Frequency) source.
5 refers to Modulator/Driver.
6 refers to Pulser.
7 refers to Power amplifier.
8 refers to Preamplifier/Receiver.
9 refers to oscilloscope.
10 refers to poles of magnet.
11 refers to Probe.

SUMMARY OF THE INVENTION

The main objective of the present invention is to provide an improved logic device utilising the spin system as a logic device/memory unit.

Another objective of the present invention is to reduce the energy for storing and recalling information, as compared to a molecular computer.

Yet another objective of the present invention is to enhance the reusability (life time) of the system in comparison to the standard molecular computer.

Still another objective of the present invention is to integrate the storage and processing of information into a single device, which could serve as a centerpiece in the development of a hybrid semiconductor-cum-spin computer, or eventually a spin computer.

BRIEF DESCRIPTION OF THE ACCOMPANYING DRAWING

In the drawings accompanying this specification i) FIG. 1 is the block diagram of a standard semiconductor based computer.

ii) FIG. 2 shows a Standard Magnetic resonance device to generate spin echoes and stimulated echoes.

iii) FIG. 3 is the block diagram of an embodiment of the device of the present invention without addressing capability.

iv) FIG. 4 shows the block diagram of another embodiment of the device of the present invention i.e. the improved logic device with memory addressing capability.

DESCRIPTION OF THE PREFERRED EMBODIMENT(S)

Figure 1:
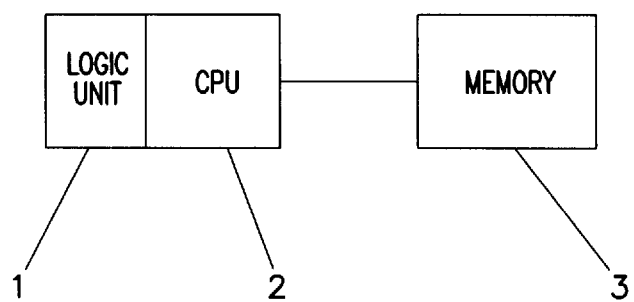
Figure 2:
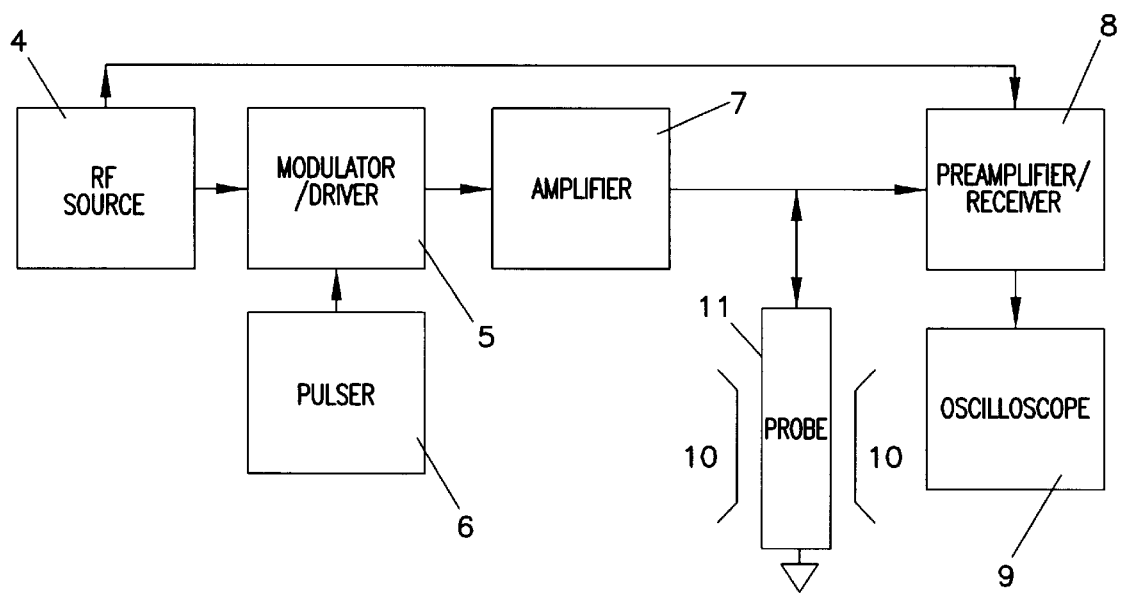

Various components, as shown with numerals in FIG. 3 of the drawings accompanying this specification, are described below.

12 refers to the RF source, which could be either a standard fixed frequency or variable frequency oscillator or synthesizer, giving continuous wave (CW) RF output at the frequency/frequencies of interest.

13 refers to Modulator/Driver, which produces the required RF pulse by modulating the Cw RF input from 12 with the DC gating pulse from 19, and buffers it for power amplification.

14 refers to Power Amplifier which amplifies the RF pulse from 13 and has a variable computer controlled attenuator at its output.

15 refers to Preamplifier/Receiver, which receives, amplifies and phase detects the analog signal from 18, with reference to the reference signal from 12.

16 refers to Analog-to-Digital converter (ADC), which is a fast, high resolution unit for converting the analog output of 15 to digital data.

17 refers to the poles of the magnet which sets up the bistable state in the spin system.

18 refers to the Probehead, which houses the spin system in the center of the magnetic field, surrounding the spin system with a Radio frequency (R.F.) coil/coils tuned to the resonance frequency/frequencies, for transmission of RF power from 14 and routing of signal to 15.

19 refers to Pulser, which generates the DC gating pulse pattern required by direct hardware generation or under software control.

20 refers to a standard Computer device, which controls the timing and performance of the rest of the hardware. Similarly, the various components, as shown with numerals in the FIG. 4 of the drawings accompanying this specification, are described below.

21 refers to the RF source, which could be either a standard fixed frequency or variable frequency oscillator or synthesizer, giving continuous wave (CW) RF output at the frequency/frequencies of interest.

22 refers to Modulator/Driver, which produces the required RF pulse by modulating the CW RF input from 21 with the DC gating pulse from 29 and buffers it for power amplification.

23 refers to Power Amplifier which amplifies the RF pulse from 22 and has a variable computer controlled attenuator at its output.

24 refers to Preamplifier/Receiver, which receives, amplifies and phase detects the analog signal from 27, with reference to the reference signal from 21.

25 refers to Analog-to-Digital Converter (ADC), which is a fast, high resolution unit for converting the analog output of 24 to digital data.

26 refers to the poles of the magnet which sets up the bistable state in the spin system.

27 refers to the Probehead, which houses the spin system in the center of the magnetic field, surrounding the spin system with a Radiofrequency coil/coils tuned to the resonance frequency/frequencies, for transmission Of RF power from 23 and routing of signal to 24 and also incorporating gradient coil to generate magnetic field gradient under control of 28.

28 refers to the gradient control unit which permits setting up and issuing any combination of three orthogonal gradient pulses for addressing 'memory elements' in the spin system.

29 refers to Pulser, which generates the DC gating pulse pattern required by direct hardware generation or under software control.

30 refers to a standard Computer device, which controls the timing and performance of the rest of the hardware.

The present invention provides an improved logic device which consists of:

a) a spin system with a sufficiently long relaxation time in a magnetic Field which provides a bi-stable state, b) probehead, console and receiver which enable the system to access the bi-stable state using magnetic resonance excitation and detection, c) field gradients that permit 'addressing' of distinct memory 'cells' in the spin system.

Accordingly, the present invention provides an improved logic device which comprises, a resonant radio frequency (RF) source (21) having a continuous wave (CW) RF output, the said CW RF output being fed to a modulator/driver (22) connected to a pulser (29) providing a DC gating pulse, the resultant RF pulse being connected to the input of a power amplifier (23), the power amplifier output being connected to a probehead (27) housing a spin system in the centre of a magnetic field (26), the probe-head (27) output being connected to the pre-amplifier/receiver (24), which also get a reference input from the RF source (21), the out put of the said preamplifier/receiver (24) being connected through an analog to digital convertor (ADC) (25) to a conventional computer device (30) capable of providing timing and performance control, another input to said probe (27) being also connected to a gradient control unit (28) capable of providing orthogonal gradient pulses for addressing memory elements in the said spin system.

In an embodiment of the invention the spin system used in this invention may have ESR (Electron spin resonance) linewidth of max. 1 MHz. and/or ENDOR (Electron Nuclear Double Resonance) line width of maximum 1 MHz. and/or NMR line width of maximum 1 MHz.

In another embodiment of the invention, external magnetic field is generated by permanent magnet or electromagnet or superconducting electromagnet or fringe field of a superconducting electromagnet. The spin system is taken in a probe, which is also known as probehead, tuned to the resonance frequency/frequencies and is placed in an external magnetic field. The system behaves, under this condition, as a system of bi-stable state each spin half having two possible spin orientations—up and down. The 'up' spin state is referred to as the logic level 'High', while the other, i.e., the 'down' state is referred to as the logic level 'Low'.

Data is 'written' by controlling the orientations of the spins, which are controlled with an appropriate system console by suitable means, like application of magnetic field pulses, resonant RF pulses or microwave pulses, or passage through inhomogeneous magnetic fields. Data, or in other words the orientational state of spins, is 'read' again by applying any of the foregoing methods, or by superconducting quantum interference devices (SQUIDS). The timescale required to write or read electron spin orientation by using resonant pulses is of the order of 1–10 ns.

Figure 3:
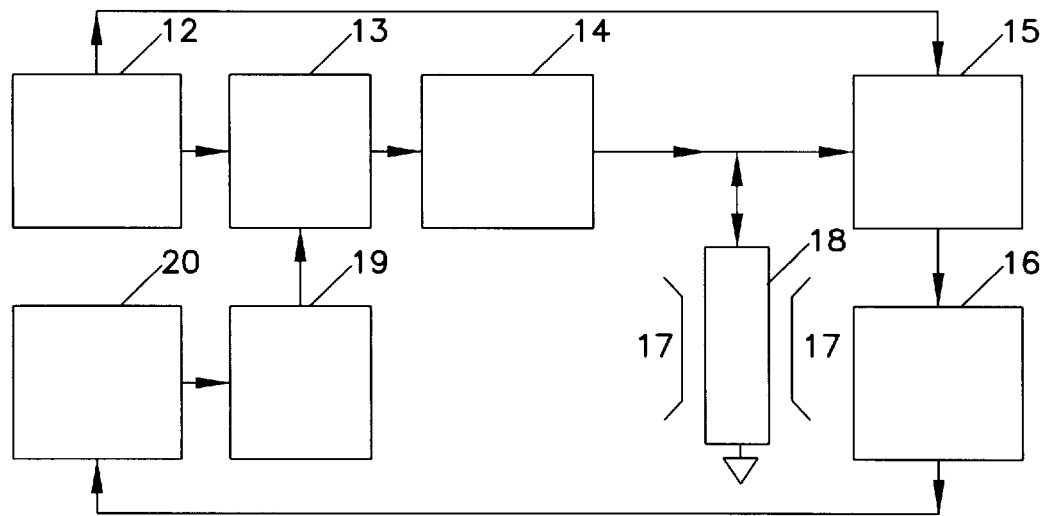
Figure 4:
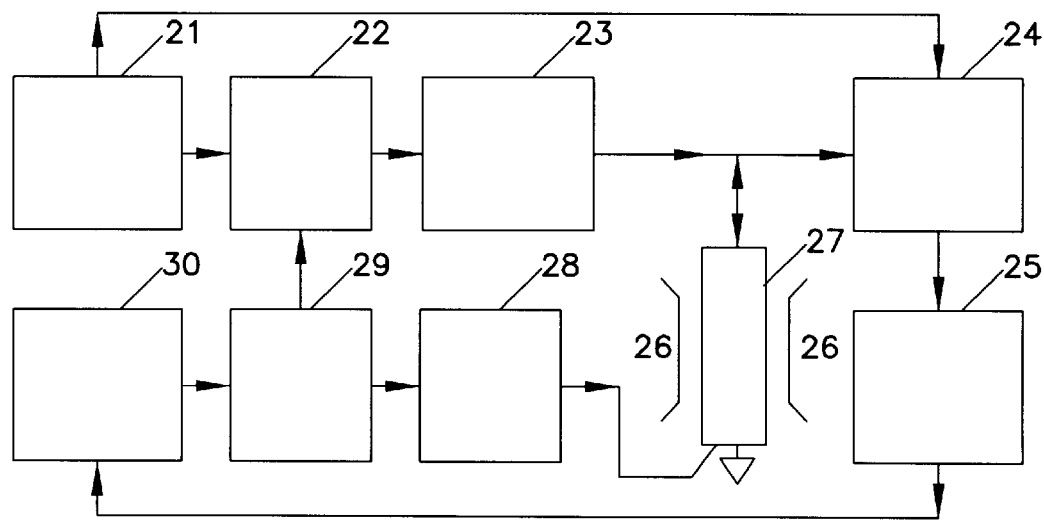

With resonant RF pulses, the orientation of a spin may be altered when the burst of radiation is at the appropriate 'resonance' frequency $v_0$, which is given in terms of the intensity of the applied magnetic field, $B_0$, by the following equation $$2\pi v_0 = \gamma B_0$$

where, $\gamma$ is the magnetogyric ratio, which is a constant for the specific spin system The system console, as represented in the block diagrams of FIG. 3 and FIG. 4, comprises of a stable, fixed frequency R source whose output is fed into a modulator which is gated by the DC (direct current) pulse output of a pulser. The frequency of operation of the RF source is determined by the intensity of the magnetic field in which the probe is located as well as the identity of the spin system that is used for the logic device. Intensity of the magnetic field is denoted by its 'poles' in the block diagrams 3 & 4 accompanying this specification. The modulator/driver output is fed to a power amplifier, which has a variable computer controlled attenuator at its output. The pulser in turn is a simple standard hardwired device, or a sophisticated standard device operated by a computer that permits the automated execution of complex excitation/detection patterns, such as the ones spelt out below in the logic scheme. The RF pulse output from this amplifier feeds a single coil or crossed coil excitation/detection probehead which houses the spin system and is located in the magnetic field. The signal output from the probehead is fed to a phase sensitive wideband receiver, whose demodulated output is sampled by a fast (ca. 10 MHz) digitizer or signal sampler with sampling frequency in the range 30 MHz–2GHz and finally stored in the computer/peripherals.

The following basic pulse rotation scheme is employed in 'writing' data, starting with the spin system in thermal equilibrium. The spin system is rotated through a certain angle, leaving the spins in the 'longitudinal' axis itself, parallel or anti-parallel to the field, corresponding to establishment of a specific Logic state of the bistable system.

Further rotation by 180° corresponds to establishment of the other Logic state. This is achieved by the aforesaid resonant means. To 'read' data, on the other hand, the following pulse rotation scheme should be employed.

Spins are 'tipped' into the transverse plane—'initial' points of free induction decay (FID) are sampled during a time in the range 1 ns to 100 ms, and reoriented to the original state by reversing the pulse rotation.

The 'polarity' of the 'initial point' of the resulting FID contains the relevant information.

The 'read' procedure outlined above ends with restoration of the initial state of the spins, corresponding to a 'read' operation that does not alter the logic state of the system. The signal from the Probehead is detected and demodulated by a phase sensitive Receiver and fast signal sampler. This is how 'data' is 'read. The probehead is located within a magnetic field that has provision for applying desired pulsed/constant field gradients to the sample, in any of a combination of three mutually orthogonal directions, called x, y and z directions, so that memory addressing is possible. RF power amplifier with pulse shaping capability is employed optionally for addressing. The implementation of the logic scheme is achieved by means of suitable modulation of the resonant RF, employing the pulser and modulator to generate desired patterns of pulse rotation of the spins.

The following examples are given by way of illustration of the present invention and should not be construed to limit the scope of the present invention.

EXAMPLE 1

Crystals of the conducting polymer, fluoranthene hexafluorophosphate, were chosen as the spin system. This polymer is long-lived paramagnetic species with narrow (20 KHz) ESR linewidth. It has long electron spin 'relaxation time'. This polymer sample was taken in a probehead and was placed in a magnetic field of a variable field electromagnet to set up the electron spin resonance condition. The magnet was operated at a nominal field intensity of 0.0107T, corresponding to an electron spin resonance frequency of 300 MHz. The current stability of the electromagnet power supply was about 1 ppm, while field homogeneity over a 1 $cm^3$ volume was about 10–20 ppm. Resonant excitation of the spin system was carried out with a Bruker MSL 300 P FT NMR spectrometer console using low power excitation through the systems decoupler low power output channel, employing assembler level programming to generate minimum possible pulse durations, ca. 400–500 ns. Pulse amplitudes were varied at this constant pulse duration to generate various desired nutation ('flip') angles. The spin response was captured with a 10 MHz digitizer. The following basic pulse rotation scheme was employed in 'writing' data, starting with the spin system in thermal equilibrium.

360° pulse rotation, corresponding to Logic state '0'
180° pulse rotation, corresponding to Logic state '1'
To read data, on the other hand, the following pulse rotation scheme was employed.

$90°_{90°}$ pulse rotation—sample 'initial' points of FID during a time of 8 $\mu s$
$180°_{0°}$—8 $\mu s$—$90°_{270°}$ pulse rotation. The 'polarity' of the 'initial point' of the resulting FID contained the relevant information, eg.:

'+ve' polarity corresponded to Logic state '0'
'−ve' polarity corresponded to Logic state '1'

By employing the device as mentioned above a bit of information was stored and subsequently recalled.

EXAMPLE 2

Water, a diamagnetic species with narrow (3 Hz) NMR. (Nuclear magnetic resonance) linewidth, was chosen as the spin system. It also possesses characteristics of long nuclear spin 'relaxation times'. This sample was taken in a probehead and was placed in a magnetic field of a fixed field superconducting electromagnet with field intensity 7T to set up the nuclear magnetic spin resonance condition at 300 MHz; Field homogeneity over a 1 $cm^3$ volume was about 0.01 ppm. Resonant excitation of the spin system was carried out with a Bruker MSL 300 P FT NMR spectrometer console using low power excitation through the system's selective excitation unit, employing assembler level programing to generate minimum possible pulse durations, approximately 128 $\mu s$. Pulse amplitudes were varied at this constant pulse duration to generate various desired nutation ('flip') angles. The spin response was captured with a 125 KHz digitizer.

The following basic pulse rotation scheme was employed in 'writing' data, starting with the spin system in thermal equilibrium.

360° pulse rotation, corresponding to Logic state '0'
180° pulse rotation, corresponding to Logic state '1'
To 'read' data, on the other hand, the following pulse rotation scheme was employed.

$90°_{90°}$ pulse rotation—sample 'initial' points of FID during a time of 20 $\mu s$
$180°_{0°}$—20 $\mu s$—$90°_{270°}$ pulse rotation.
The 'polarity' of the 'initial point' of the resulting FID contained the relevant information, eg.:

'+ve' polarity corresponded to Logic state '0'
'−ve' polarity corresponded to Logic state '1'

By employing the device as mentioned above a bit of information was stored and subsequently recalled.

Addressing was accomplished with pulse field gradients generated in the probehead employing a gradient amplifier system, with gradient amplitudes of 0.0007T $cm^{-1}$.

EXAMPLE 3

Protons of Solid polymethyl maethacrylate (PMMA), were chosen as the spin system. PMMA was taken in a probehead and was placed in the fringe of a magnetic field of a fixed field superconducting electromagnet with fringe field intensity of ca. 2.75T to set up the nuclear magnetic spin resonance condition at 118 MHz. Field inhomogeneity corresponded to about 30T $m^{-1}$.

Resonant excitation of the spin system was carried out with a Bruker MSL 300 P FT NMR spectrometer console using high power excitation through the system's high power transmitter unit, employing assembler level programming to generate minimum possible pulse durations, ca. 400–500 ns. Pulse amplitudes were varied at this constant pulse duration to generate various desired nutation ('flip') angles. The spin response was captured with a 125 kHz/10 MHz digitizer.

The following basic pulse rotation scheme was employed in 'writing' data, starting with the spin system in thermal equilibrium.

360° pulse rotation, corresponding to Logic state '0'

180° pulse rotation, corresponding to Logic state '1'

To 'read' data, on the other hand, the following pulse rotation scheme was employed.

$90°_{90°}$ pulse rotation—sample 'initial' points of FID during a time of 20 µs $180°_{0°}$—20 µs—$90°_{270°}$ pulse rotation.

The 'polarity' of the 'initial point' of the resulting FID contained the relevant information, eg.:

'+ve' polarity corresponded to Logic state '0'

'−ve' polarity corresponded to Logic state '1'

By employing the device as mentioned above a bit of information was stored and was recalled subsequently.

The main advantages of the improved logic device of the present invention are the following.

1. The device is able to 'write' or 'store' and 'read' data, a defined by pulse rotations on the spin system.

2. Unlike sequential memory storage in spin memory devices, accessing of memory is possible in random and/or parallel mode.

3. Higher reusability compared to the standard molecular systems.

4. Possibility of integrating storage and processing of information.

5. Inherent parallel processing capabilities.

6. Spin-half system, unlike a molecular computer, is a genuine bi-stable system.

We claim:

1. An improved logic device which comprises, a resonant radio frequency (RF) source having a continuous wave (CW) RF output, the CW RF output being fed to a modulator/driver connected to a pulser providing a DC gating pulse, the resultant RF pulse being connected to the input of a power amplifier, the power amplifier output being connected to a probehead housing a spin system in the center of a magnetic field, the probehead output being connected to a preamplifier/receiver, which also get a reference input from the RF source, the output of said preamplifier/receiver being connected through an analog to digital convertor (ADC) to a computer device capable of providing timing and performance control, another input to said probehead being connected to a gradient control unit capable of providing orthogonal gradient pulses for addressing memory elements in said spin system.

2. An improved logic device as claimed in claim 1 wherein the resonant frequency (RF) source comprises one of a fixed-frequency oscillator, a variable frequency oscillator and a synthesizer, capable of providing the continuous wave (CW) RF output.

3. An improved logic device as claimed in claim 1 wherein the power amplifier has a variable computer controlled attenuator at its output or has pulse shaping capability.

4. An improved logic device as claimed in claim 1 wherein the magnetic field provided is generated by means comprising one of a permanent magnet, an electromagnet, superconducting electromagnet with a homogeneous magnetic field, and the fringe field of a superconducting electromagnet.

5. An improved logic device as claimed in claim 1 wherein the spin system comprises a collection of interacting or noninteracting spin-½.

6. An improved logic device as claimed in claim 1 wherein the spin system comprises one of an electron spin system with Electron spin resonance (ESR) line width of maximum 1 MHz., an Electron Nuclear Double resonance (ENDOR) line width of maximum 1 MHz., or a diamagnetic nuclear spin system in liquid or solid system with line width of maximum 1 MHz.

7. An improved logic device as claimed in claim 1 wherein the probehead has a radio frequency coil tuned to the resonance frequency.

* * * * *